US006812736B2

(12) United States Patent
Best et al.

(10) Patent No.: US 6,812,736 B2
(45) Date of Patent: Nov. 2, 2004

(54) METHOD AND APPARATUS FOR SELECTABLY PROVIDING SINGLE-ENDED AND DIFFERENTIAL SIGNALING WITH CONTROLLABLE IMPEDANCE AND TRANSITION TIME

(75) Inventors: Scott Best, Palo Alto, CA (US); Chiping Yang, Sunnyvale, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/715,477

(22) Filed: Nov. 19, 2003

(65) Prior Publication Data

US 2004/0100309 A1 May 27, 2004

Related U.S. Application Data

(63) Continuation of application No. 10/079,143, filed on Feb. 19, 2002, now Pat. No. 6,683,472.

(51) Int. Cl.[7] .............................................. H03K 17/16
(52) U.S. Cl. .............................. 326/30; 326/83; 326/86; 326/90; 326/327; 326/108
(58) Field of Search .............................. 326/30, 83, 86, 326/90; 327/108–112

(56) References Cited

U.S. PATENT DOCUMENTS

| | | | |
|---|---|---|---|
| 5,939,904 A | 8/1999 | Fetterman et al. | |
| 6,005,895 A | 12/1999 | Perino et al. | |
| 6,069,523 A | 5/2000 | Brown | |
| 6,294,924 B1 | 9/2001 | Ang et al. | |
| 6,346,832 B1 | 2/2002 | Young | |
| 6,448,813 B2 * | 9/2002 | Garlepp et al. | 326/83 |
| 6,507,225 B2 * | 1/2003 | Martin et al. | 327/108 |
| 6,639,423 B2 * | 10/2003 | Martin et al. | 326/30 |
| 6,683,472 B2 * | 1/2004 | Best et al. | 326/30 |
| 2004/0000924 A1 | 1/2004 | Best et al. | |

* cited by examiner

Primary Examiner—Vibol Tan
(74) Attorney, Agent, or Firm—Hunton & Williams LLP

(57) ABSTRACT

A method and apparatus for selectably providing single-ended and differential signaling with controllable impedance and transition time is provided. According to the method and apparatus, a differential signal can be transmitted over two wires or two single-ended signals can be transmitted over the two wires. According to the method and apparatus, termination may be selected among a single-reference termination, a center termination, or a high-impedance termination. Regardless of the type of termination selected, a capability for dynamic control of the termination impedance is provided. Moreover, an ability to change impedances of termination elements to maintain a desired termination impedance for both single-reference termination and center termination modes by shifting bits is provided. Also, a capability for dynamic control of transition times of signals is provided.

44 Claims, 10 Drawing Sheets

METHOD AND APPARATUS FOR SELECTABLY PROVIDING SINGLE-ENDED AND DIFFERENTIAL SIGNALING WITH CONTROLLABLE IMPEDANCE AND TRANSITION TIME

CROSS-REFERENCE TO RELATED APPLICATIONS

This patent application is a continuation of U.S. patent application Ser. No. 10/079,143, filed Feb. 19, 2002, now U.S. Pat. No. 6,683,472 which is hereby incorporated by reference herein in its entirety.

FIELD OF THE DISCLOSURE

The present invention relates generally to electrical signaling techniques and more particularly to signaling techniques compatible with single-ended and differential signaling.

BACKGROUND

Electronic components are used to perform various functions, for example, to store data, to process data, and to communicate data. However, for such electronic components to function cooperatively, they need to be able to communicate among each other. Various signaling techniques have been developed to facilitate such communication. One such signaling technique is referred to as single-ended signaling. In single-ended signaling, a single wire, which may be any type of conductive path, may be used to communicate a signal by varying a parameter, such as a voltage on that wire with respect to a reference voltage, such as ground. Such a reference voltage may be used as a common reference voltage for several single-ended signals. Another type of signaling technique is referred to as differential signaling. In differential signaling, two wires, which may be any type of conductive paths, may be used to communicate a signal by varying a parameter of one of the wires with respect to a parameter of the other wire. Such signaling is referred to as differential signaling. The meaning or value of a signal communicated using a differential signaling system is typically determined by comparison of the parameters of the wires relative to each other, rather than relative to a common reference voltage.

Driver circuits used to produce the signals communicated between electronic components have generally been designed to provide either single-ended signaling or differential signaling, but have not generally been capable of selectably providing both types of signaling. Thus, single-ended driver circuits have not generally been compatible with differential signaling systems, and differential driver circuits have not generally been compatible with single-ended signaling systems.

To reduce reflections and other unwanted distortion of signals, the wires to which signals are applied are sometimes terminated with an appropriate termination impedance. An additional difficulty that relates to single-ended and differential signaling is that different types of terminations are sometimes used with single-ended signaling and differential signaling. For example, for single-ended signaling, a wire used for signaling preferably is center terminated (e.g., with one terminating element coupled from the wire to a first reference voltage and another terminating element coupled from the wire to a second reference voltage). As a counterexample, for differential signaling, each wire used for signaling preferably is terminated with a single terminating element coupled to a single reference voltage. Therefore, it is difficult to apply one termination scheme that optimizes performance for both types of signaling systems.

FIG. 1 is a drawing including schematic diagrams of single-reference terminations and a center termination in accordance with the prior art. In a first example of a single-reference termination illustrated in FIG. 1, wire 103 is coupled to terminating element 102, which is coupled to a first reference voltage 101. In a second example of a single-reference termination illustrated in FIG. 1, wire 104 is coupled to terminating element 105, which is coupled to a second reference voltage 106. In an example of a center termination illustrated in FIG. 1, wire 109 is coupled to terminating elements 108 and 110. Terminating element 108 is coupled to first reference voltage 107, while terminating element 110 is coupled to second reference voltage 111.

Drivers for single-ended signaling systems have not provided compatibility with differential signaling systems, and drivers for differential signaling systems have not provided compatibility with single-ended signaling systems, thereby increasing manufacturing costs and inventory requirements. Thus, neither the single-ended nor differential signaling techniques of the past have provided the flexibility to overcome these difficulties and limitations. Therefore, what is needed is a method and apparatus to overcome the disadvantages described above.

DETAILED DESCRIPTION OF THE INVENTION

Figure 1:
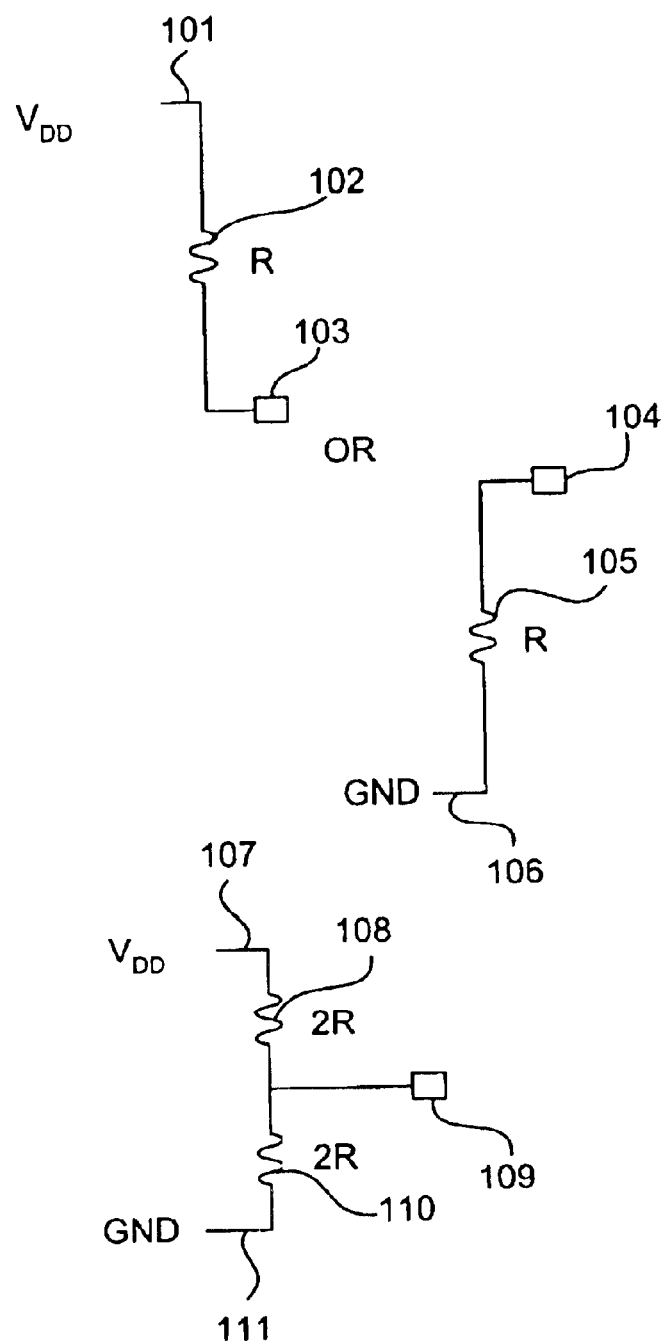
FIG. 1 is a drawing including schematic diagrams of single-reference terminations and a center termination in accordance with the prior art.

Methods and apparatuses for selectably providing single-ended and differential signaling with controllable impedance and transition time are provided. According to at least some embodiments of the methods and apparatuses, a differential signal can be transmitted over two wires or two single-ended signals can be transmitted over the two wires. These wires may be any type of conductive path, for example, any type of conductor, any type of transmission line, or any type of electrical interface. According to various embodiment of the present invention, termination may be selected among a single-reference termination, a center termination, or a high-impedance termination. A selected termination may be chosen to match the characteristic impedance, overterminate relative to the characteristic impedance, or underterminate relative to the characteristic impedance. Regardless of the type of termination selected, a capability for dynamic control of the termination impedance is provided. Moreover, in at least some embodiments, an ability to change impedances of termination elements to maintain a desired, preferably matched, termination impedance for both single-reference termination and center termination modes by shifting bits is provided. An integrated circuit having the components for providing a termination is also provided, thereby improving impedance matching. Also, a capability for dynamic control of transition times of signals is provided. By providing the ability to drive and terminate single-ended and differential signaling systems, increased compatibility and flexibility is provided, and manufacturing costs and inventory requirements are reduced. In accordance with various embodiments of the invention, one, some, or all of these features and other features described herein may be provided.

Embodiments of the invention may be usefully applied in a variety of situations. For example, embodiments may be practiced with any electrical interface. One example of such an electrical interface is any connection between one or more integrated circuits and one or more other integrated circuits. As a further example, embodiments may be practiced so as to allow one or more integrated circuits compatible with single-ended signaling to be connected to one or more integrated circuits compatible with differential signaling. The present invention may be usefully applied, for example, in a memory system. In the past, memory systems have often used single-ended signaling, for example, single-ended signaling with center terminations. Now, however, memory systems are using differential signaling, for example, differential signaling with single-reference terminations. Thus, embodiments of the present invention may be used to provide compatibility with older and newer generations of memory systems in a single part, thereby avoiding the production and inventory difficulties of producing multiple parts and allowing a single part to interact with memory system components of both types. As one example, an embodiment of the invention may be practiced in a memory controller which may be coupled to memory devices. As another example, an embodiment of the invention may be practiced in a memory device which may be coupled to a memory controller. As yet another example, an embodiment of the invention may be practiced in one or more memory controllers which may be coupled to one or more memory devices.

Figure 2:
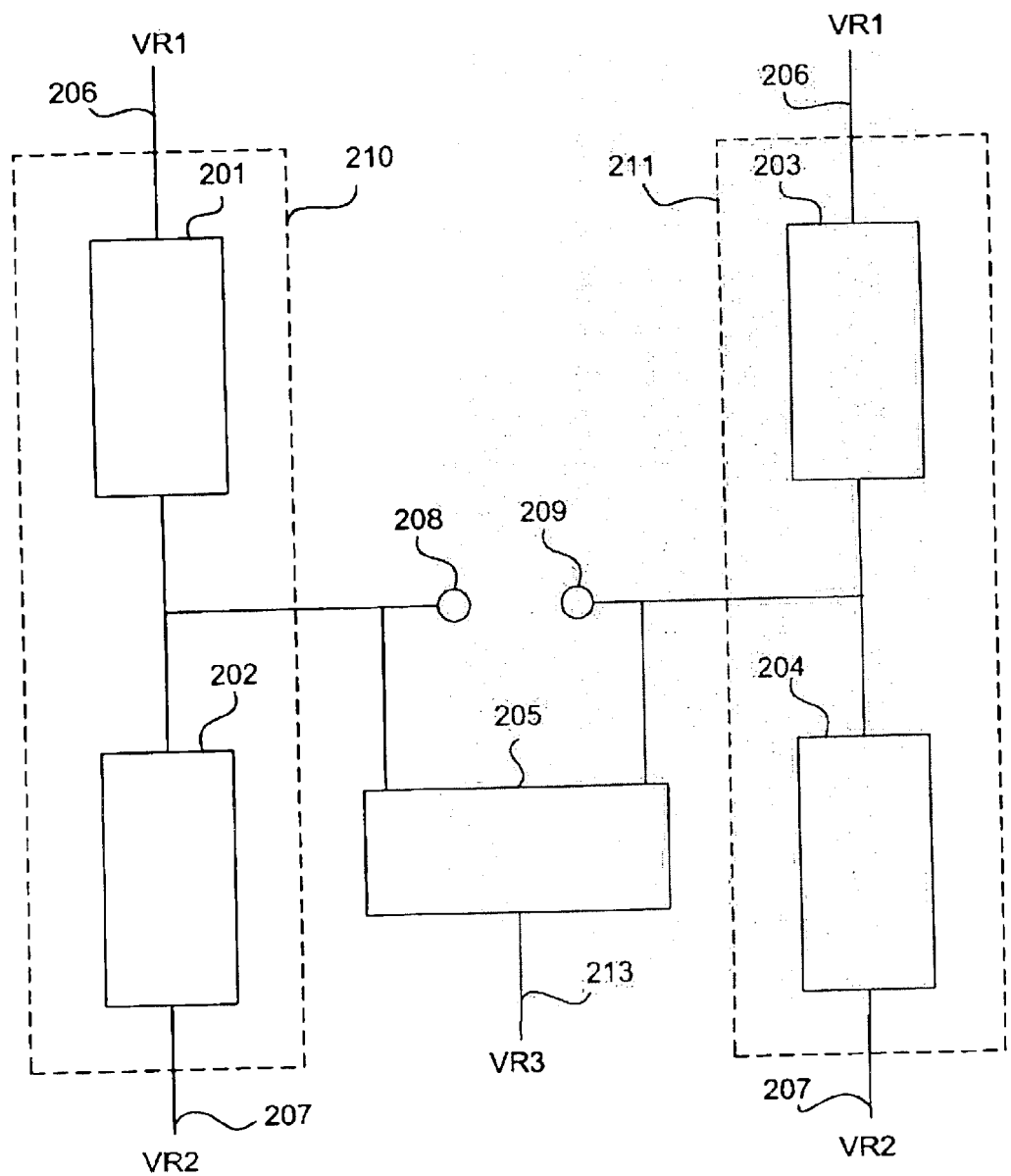
FIG. 2 is a block diagram illustrating an apparatus in accordance with an embodiment of the present invention.

FIG. 2 is a block diagram illustrating an apparatus in accordance with an embodiment of the present invention. The apparatus comprises a first single-ended drive circuit 210, a second single-ended drive circuit 211, and a differential drive circuit 205. The first single-ended drive circuit 210 comprises a first high side 201 and a first low side 202. The second single-ended drive circuit 211 comprises a second high side 203 and a second low side 204. A first reference voltage 206, which may be referred to as VR1, is coupled to the first high side 201 and to the second high side 203. The first high side 201 is coupled to the first low side 202 and to a first wire 208. The second high side 203 is coupled to the second low side 204 and to a second wire 209.

The first low side 202 and the second low side 204 are coupled to a second reference voltage 207, which may be referred to as VR2. The differential drive circuit 205 is coupled to the first wire 208, the second wire 209, and to a third reference voltage 213, which may be referred to as VR3. VR3 may be the same voltage as either VR1 or VR2, or it may be a different voltage. First wire 208 and second wire 209 provide two ports which may be used for uni-directional or bi-directional signaling in either a single-ended mode or a differential mode. For example, two different signals conveying different information may be communicated over wires 208 and 209 when they are used in a single-ended mode. Both wires 208 and 209 can be used to convey the same information at any given time when they are used in a differential mode. The information may be transmitted or received, wherein transmitted or transmission mode refers to the local component (e.g., the component illustrated by the apparatus of FIG. 2) driving signals on wires (e.g., wires 208 and 209) for reception by a remote component, and wherein received or reception mode refers to a local component detecting signals originating from a remote component.

The first single-ended drive circuit 210 and the second single-ended drive circuit 211 provide an ability to drive single-ended signals onto wires 208 and 209, respectively, by virtue of electromotive force provided by first reference voltage 206 and/or second reference voltage 207. Furthermore, the first single-ended drive circuit 210 and the second single-ended drive circuit 211 provide an ability to provide terminations for wires 208 and 209 with respect to either or both of first reference voltage 206 and/or second reference voltage 207. Additionally, the first single-ended drive circuit 210 and the second single-ended drive circuit 211 provide an ability to avoid loading wires 208 and 209 by providing a high-impedance mode, wherein a high-impedance relationship exists between either or both of first reference voltage 206 and/or second reference voltage 207 and wires 208 and 209. It should be understood that additional elements similar to first high side 201, first low side 202, second high side 203, and/or second low side 204 may be provided with respect to similar or additional reference voltages. As one example, such additional elements can be implemented with respect to additional reference voltages of a multilevel signaling system.

First high side 201 provides an ability to drive wire 208 closer to first reference voltage 206. First high side 201 provides an ability to drive signals at a high logic level onto wire 208. A high logic level is preferably a logic level corresponding to a voltage level nearer to a higher reference voltage. First high side 201 further provides an ability to provide a termination of wire 208 with respect to the first reference voltage 206. Additionally, first high side 201 provides an ability to isolate wire 208 from the first reference voltage 206 and to avoid loading wire 208 by providing a high-impedance mode, wherein a high-impedance relationship exists between the first reference voltage 206 and wire 208.

First low side 202 provides an ability to drive wire 208 closer to second reference voltage 207. First low side 202 provides an ability to drive signals at a low logic level onto wire 208. A low logic level is preferably a logic level corresponding to a voltage level nearer to a lower reference voltage. First low side 202 further provides an ability to provide a termination of wire 208 with respect to the second reference voltage 207. Additionally, first low side 202 provides an ability to isolate wire 208 from the second reference voltage 207 and to avoid loading wire 208 by providing a high-impedance mode, wherein a high-impedance relationship exists between the second reference voltage 207 and wire 208.

Second high side 203 provides an ability to drive wire 209 closer to first reference voltage 206. Second high side 203 provides an ability to drive signals at a high logic level onto wire 209. Second high side 203 further provides an ability to provide a termination of wire 209 with respect to the first reference voltage 206. Additionally, second high side 203 provides an ability to isolate wire 209 from the first reference voltage 206 and to avoid loading wire 209 by providing a high-impedance mode, wherein a high-impedance relationship exists between the first reference voltage 206 and wire 209.

Second low side 204 provides an ability to drive wire 209 closer to second reference voltage 207. Second low side 204 provides an ability to drive signals at a low logic level onto wire 209. Second low side 204 further provides an ability to provide a termination of wire 209 with respect to the second reference voltage 207. Additionally, second low side 204 provides an ability to isolate wire 209 from the second reference voltage 207 and to avoid loading wire 209 by providing a high-impedance mode, wherein a high-impedance relationship exists between the second reference voltage 207 and wire 209.

Differential drive circuit 205 provides an ability to create a voltage difference between wires 208 and 209. In creating such a voltage difference, one of wires 208 and 209 is driven to a voltage level closer to third reference voltage 213, while the other of wires 208 and 209 is allowed to move to a voltage level away from third reference voltage 213.

Figure 3:
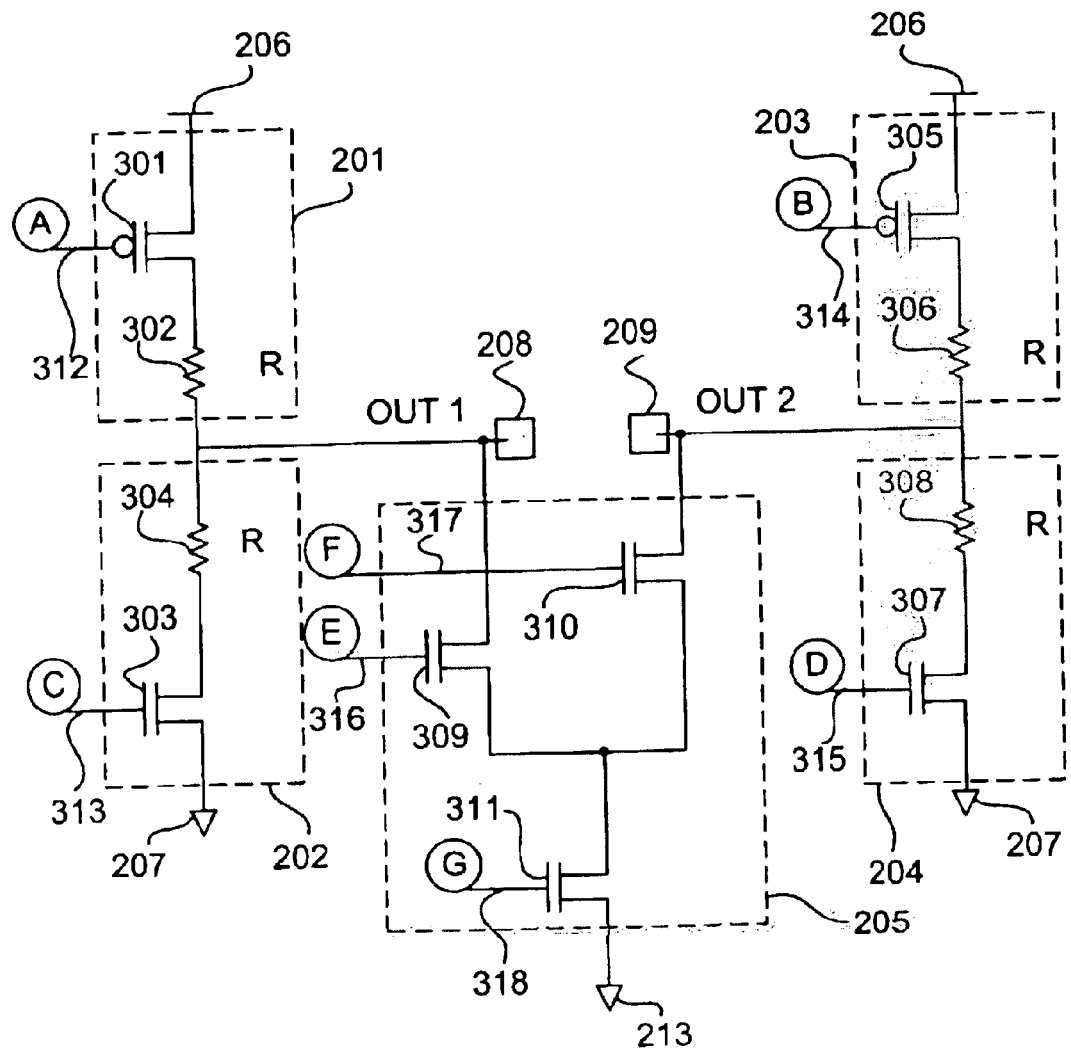
FIG. 3 is a schematic diagram illustrating an apparatus in accordance with an embodiment of the present invention.

FIG. 3 is a schematic diagram illustrating an apparatus in accordance with an embodiment of the present invention. The apparatus comprises the first high side 201, the first low side 202, the second high side 203, the second low side 204, and the differential drive circuit 205. The first high side 201 comprises a switching device 301, which may, for example, be a transistor (e.g., a PMOS transistor), and a resistive device 302, which may, for example, be a resistor or a device (e.g., a transistor) configured to pass current in a manner that effectively emulates a resistor. As an example, a transistor may be configured to emulate a resistor by carefully controlling the dimensions, geometry, and process parameters during the fabrication of the transistor. The first reference voltage 206, which may, for example, be a positive or negative voltage or a ground voltage (e.g., $V_{DD}$), is coupled to the switching device 301. The switching device 301 is coupled to the resistive device 302. The resistive device is coupled to the first wire 208. The first low side 202 comprises a switching device 303, which may, for example, be a transistor (e.g., a NMOS transistor), and a resistive device 304, which may, for example, be a resistor or a device (e.g., a transistor) configured to pass current in a manner that effectively emulates a resistor. The second reference voltage 207, which may, for example, be a positive or negative voltage or a ground voltage (e.g., ground), is coupled to switching device 303. The switching device 303 is coupled to the resistive device 304. The resistive device 304 is coupled to the first wire 208.

The second high side 203 comprises a switching device 305, which may, for example, be a transistor (e.g., a PMOS transistor), and a resistive device 306. The first reference voltage is coupled to the switching device 305. The switching device 305 is coupled to the resistive device 306. The resistive device 306 is coupled to the second wire 209. The second low side 204 comprises a switching device 307, which may, for example, be a transistor (e.g., a NMOS transistor), and a resistive device 308. The second reference voltage is coupled to the switching device 307. The switching device 307 is coupled to the resistive device 308. The resistive device 308 is coupled to the second wire 209.

The differential drive circuit 205 comprises switching devices 309 and 310, which may, for example, be transistors (e.g., NMOS transistors), and a bias control device 311, which may, for example, be a transistor (e.g., a NMOS transistor). The second reference voltage 207 is coupled to the bias control device 311, which is coupled to the switching devices 309 and 310. Switching device 309 is coupled to wire 208, and switching device 310 is coupled to wire 209.

An input 312 is provided to control switching device 301. An input 313 is provided to control switching device 303. An input 314 is provided to control switching device 305. An input 315 is provided to control switching device 307. An input 316 is provided to control switching device 309. An input 317 is provided to control switching device 310. An input 318 is provided to control bias control device 311. A control circuit is coupled to one or more of these inputs to control operation of the apparatus. For example, to operate the apparatus in a single-ended transmission mode, the control circuit applies a control signal (e.g., a ground voltage) to inputs 316, 317, and 318, a first data signal, which may, for example, be the first data signal or the inverse thereof, to inputs 312 and 313, and, optionally, a second data signal, which may, for example be the second data signal or the inverse thereof, to inputs 314 and 315. In such an example, the differential drive circuit is disabled, and signals are driven on the first and second wires by the first and second single-ended drive circuits in accordance with the first and second data signals.

As another example, to operate the apparatus in a single-ended reception mode, the control circuit applies a first control signal (e.g., a $V_{DD}$ voltage) to inputs 313 and 315 and a second control signal (e.g., a ground voltage) to inputs 312, 314, and 316–318. In such an example, the differential drive circuit is disabled, and the switching devices of the high and low sides of the first and second single-ended drive circuits are activated so as to complete current paths through the resistive devices of the high and low sides of the first and second single-ended drive circuits, thereby resulting in a center terminated configuration for both the first wire 208 and the second wire 209.

As a further example, to operate the apparatus in a differential transmission mode, the control circuit applies a first control signal (e.g., a ground voltage) to inputs 312–315, a second control signal (e.g., a bias control voltage) to input 318, a data signal to input 316, and an inverse of the data signal to input 317. In such an example, the switching devices of the high sides of the first and second single-ended drive circuits are activated so as to complete current paths through the resistive devices of the high sides of the first and second single-ended drive circuits. The low sides of the first and second single-ended drive circuits are disabled. A differential output signal is provided across wires 208 and 209 by the operation of switching devices 309 and 310 under the influence of the data signal.

As yet another example, to operate the apparatus in a differential reception mode, the control circuit applies a first control signal (e.g., a ground voltage) to inputs 312–318. In such an example, the differential drive circuit and the low sides of the first and second single-ended drive circuits are disabled. The switching devices of the high sides of the first and second single-ended drive circuits are activated so as to complete current paths through the resistive devices of the high sides of the first and second single-ended drive circuits, thereby providing single-reference terminations for both the first wire 208 and the second wire 209.

As one more example, the apparatus is capable of operating in a high-impedance mode. In a high-impedance mode, the apparatus effectively isolates wires 208 and 209 from the influence of any of first reference voltage 206, second voltage reference 207, and third voltage reference 213. Thus, the apparatus avoids imparting electrical effects on wires 208 or 209 that would affect operation of remote components coupled to wires 208 and 209. To operate the apparatus in a high-impedance mode, the control circuit applies a first control signal (e.g., a ground voltage) to inputs 313 and 315–318 and a second control signal (e.g., a $V_{DD}$ voltage) to inputs 312 and 314. In such an example, the differential drive circuit and the high and low sides of both the first and the second single-ended drive circuits are disabled, thereby providing high impedances (e.g., essentially open circuits) between wires 208 and 209 and any reference voltages (e.g., first reference voltage 206 and second reference voltage 207).

Figure 4:
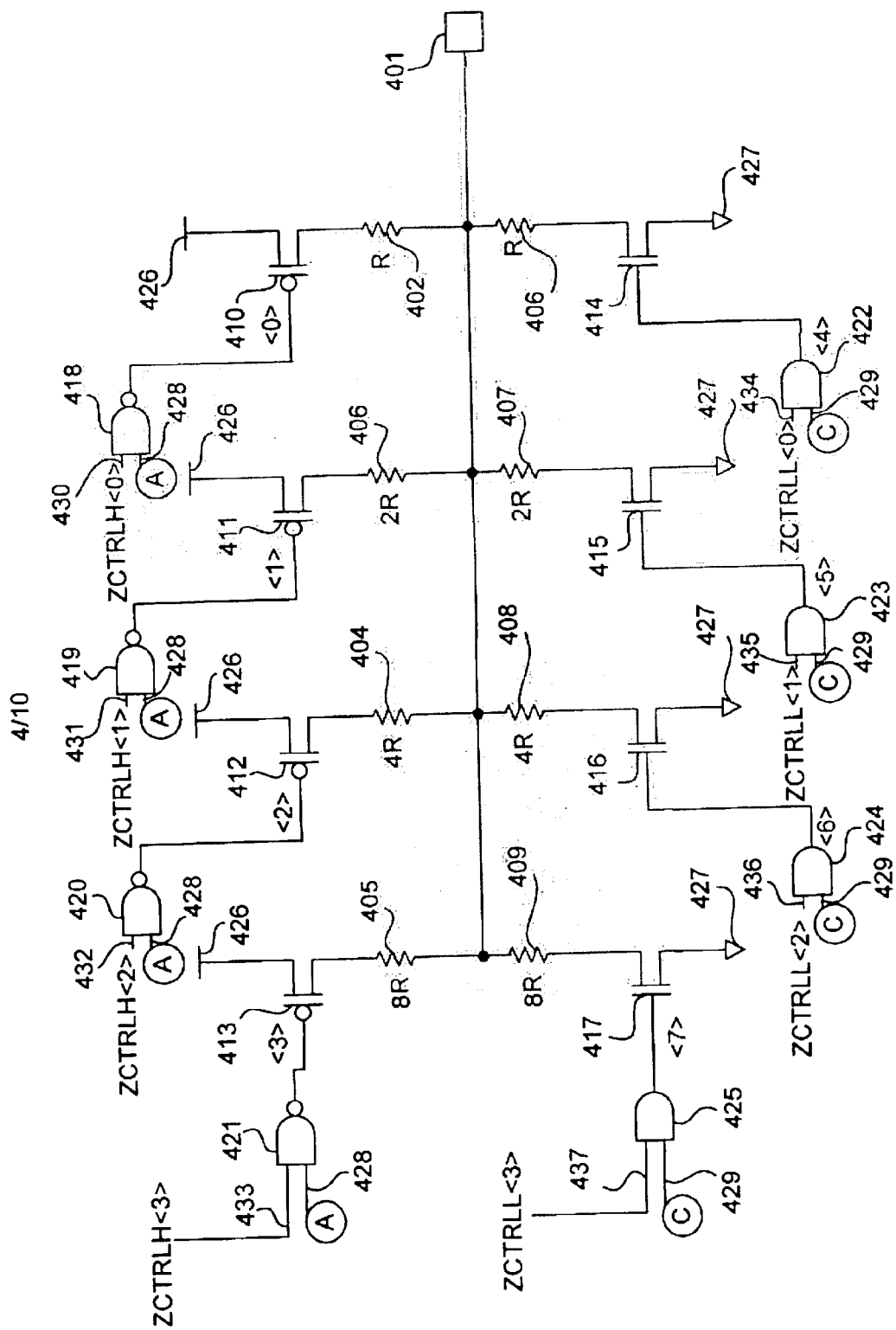
FIG. 4 is a detailed schematic diagram illustrating an apparatus allowing selectable termination impedance control in accordance with an embodiment of the present invention.

FIG. 4 is a detailed schematic diagram illustrating an apparatus allowing selectable termination impedance control in accordance with an embodiment of the present invention. Such an apparatus may be used to implement an apparatus such as that illustrated in FIGS. 2 and 3, or it may be used independently of apparatus such as that illustrated in FIGS. 2 and 3. For example, the apparatus of FIG. 4 may be used to implement the first and second single-ended drive circuits of FIGS. 2 and 3. As another example, the apparatus of FIG. 4 may be used to provide a selectable termination impedance for other types of circuits (e.g., a receive circuit or a termination circuit). The apparatus of FIG. 4 comprises a plurality of switching devices and a plurality of resistive devices, which may be separate devices or devices providing both switching and resistive properties by themselves. As an example, a transistor may be configured to provide both switching and resistive properties. The switching devices and resistive devices are coupled as pairs in series to allow the switching devices to selectably enable and disable the resistive devices. Some of these pairs may be coupled between a wire and a first reference voltage (e.g., a VDD voltage), while others of these pairs may be coupled between the wire and a second reference voltage (e.g., a ground voltage). Alternatively, all of the pairs may be coupled between the wire and a single reference voltage (e.g., the first or second reference voltage). The resistive devices may purely resistive (except for small parasitic reactances that may be present) or may provide a complex impedance.

Among pairs coupled to a common reference voltage, enabling several of these pairs results in a termination impedance as a function of the parallel combination of the impedance values of each of the pairs. Thus, a wide range of possible termination impedance values can be provided. As one example, if resistive devices are selected having impedance values that are exponentially related to one another, a few resistive devices can be used to provide a large number of possible termination impedance values. As an example of one such exponential relationship, a first resistive device may exhibit a resistance R, a second resistive device may exhibit a resistance 2R, a third resistive device may exhibit a resistance 4R, a fourth resistive device may exhibit a resistance 8R, and so on. It should be understood that such an exponential relationship need not be mathematically precise. For example, since the switching devices may exhibit some finite resistance even when they are activated, the values of the resistive devices may be selected to compensate for such resistances, or, alternatively, such resistances may be considered negligible and no compensation may be needed.

One inventive feature for resistive devices having an exponential relationship based on powers of two (e.g., R, 2R, 4R, 8R, etc.) is that, by shifting control inputs by one bit, the impedance provided by the group of resistive devices can be easily doubled or halved. This feature is particularly useful for switching between a single-reference termination and a center termination while maintaining a particular termination impedance, for example, a termination impedance intended to match a characteristic impedance of a wire to which the apparatus is coupled.

As another example, the apparatus of FIG. 4 may be implemented using more than one resistive device of one impedance value. Thus, for example, if two or more resistive devices having a value 2R are provided, doubling or halving the impedance of the group of resistive devices can be accomplished by selecting either one or both of the resistive devices. To continue with this example, if one of the resistive devices having a value 2R is enabled, but the other is disabled, the two resistive devices provide a resistance of 2R. However, if both of the resistive devices having a value 2R are enabled, the two resistive devices provide a resistance of R (i.e., half of 2R). Such a configuration is also well suited for maintaining a particular termination impedance while providing either a single-reference termination or a center termination. For example, to provide a single-reference termination, the group of resistors can be configured to provide a resistance of R between the wire and the reference voltage. However, to provide a center termination, the group of resistors can be configured to provide a resistance of 2R between the wire and the first reference voltage, while a second group of resistors can be configured to provide a resistance of 2R between the wire and a second reference voltage. From an alternating-current (AC) perspective, the effective AC termination impedance remains R (neglecting any reactive components) for either configuration, since the two resistances of 2R serve in parallel to provide an effective AC termination impedance of R.

The apparatus illustrated in FIG. 4 comprises resistive devices 402–409 coupled to wire 401. Switching devices 410–417 are coupled to resistive devices 402–409, respectively. Switching devices 410–413, which may, for example, be PMOS transistors, are coupled to a first reference voltage 426, which may, for example, be $V_{DD}$. Switching devices 414–417, which may, for example, be NMOS transistors, are coupled to a second reference voltage 427, which may, for example, be a ground voltage. Control inputs of switching devices 410–413 are coupled to outputs of logic gates 418–421, respectively. Control inputs of switching devices 414–417 are coupled to outputs of logic gates 422–425, respectively. Control input 428, which serves as a common enable signal for resistive devices 402–405, is coupled to one of the inputs of each of logic gates 418–421. Control input 429, which serves as a common enable signal for resistive devices 406–409, is coupled to one of the inputs of each of logic gates 422–425. Logic gates 418–421 may be NAND gates or another type of logic gate. Logic gates 422–425 may be AND gates or another type of logic gate. Control inputs for resistive devices 402–409 are provided to inputs 430–437 of logic gates 418–425, respectively. In some embodiments, it may be preferable to use the same control input for inputs 430 and 434, for inputs 431 and 435, for inputs 432 and 436, and for inputs 433 and 437 or to shift those control inputs by one bit in either direction, so as to maintain a desired termination impedance.

Figure 5:
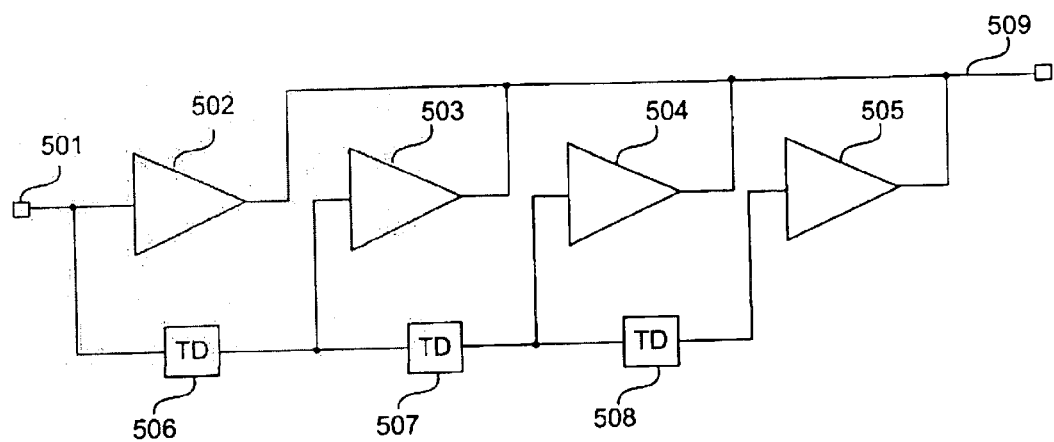
FIG. 5 is a block diagram illustrating an apparatus allowing selectable transition time control in accordance with an embodiment of the present invention.

FIG. 5 is a block diagram illustrating an apparatus allowing selectable transition time control in accordance with an embodiment of the present invention. The apparatus of FIG. 5 comprises an input 501, drive circuits 502–505, adjustable time delay elements 506–508, and output 509. Input 501 is coupled to an input of drive circuit 502 and to an input of adjustable time delay element 506. An output of adjustable time delay element 506 is coupled to an input of drive circuit 503 and to an input of adjustable time delay element 507. An output of adjustable time delay element 507 is coupled to an input of drive circuit 504 and to an input of adjustable time delay element 508. An output of adjustable time delay element 508 is coupled to an input of drive circuit 505. An output of each of drive circuits 502–505 is coupled to output 509.

If adjustable time delay elements 506–508 are adjusted to provide minimal time delay, drive circuits 502–505 change state almost simultaneously (ideally, simultaneously), resulting collectively in very fast transition times (e.g., times to switch between output states). However, as more delay is introduced at adjustable time delay elements 506–508, drive circuits 502–505 change state sequentially. Since each of drive circuits has a finite (e.g., non-zero) output impedance, the overall output impedance of output 509 is decreased over time, resulting in a more gradual change between output states and, consequently, a slower transition time. Thus, the apparatus of FIG. 5 can provide selectable transition times for signals at output 509.

As an example of one possible variation of the apparatus of FIG. 5, the inputs of adjustable time delay elements 507 and 508 could be coupled to input 501, with the adjustable time delay elements 506–508 configured in parallel rather than series. The values of the time delays of adjustable time delay elements 507 and 508 could be adjusted to provide the desired effect.

Viewed in the context of FIGS. 2–4, the apparatus of FIG. 5 can be implemented such that each of drive circuits 502–505 comprises a single-ended drive circuit, a high side or low side of a single-ended drive circuit, a differential drive circuit, or the apparatus of FIG. 4. If, for example, each of drive circuits 502–505 were implemented according to the apparatus of FIG. 4, the combined benefits of selectable impedance and selectable transition time can be obtained. Control of timing for the adjustable time delay elements can be provided using the same control circuit as used to control the apparatus of FIGS. 2, 3, or 4.

Figure 6:
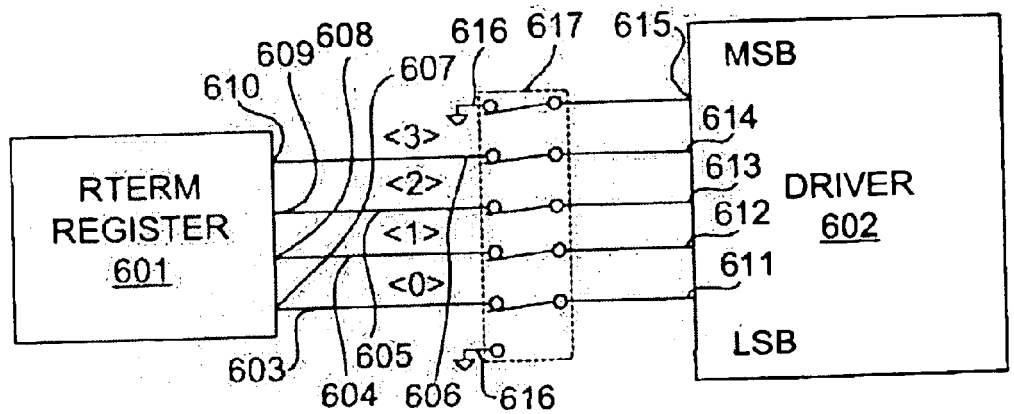
FIG. 6 is a block diagram illustrating an apparatus allowing change in termination impedance by shifting bits in accordance with an embodiment of the present invention.
Figure 6:
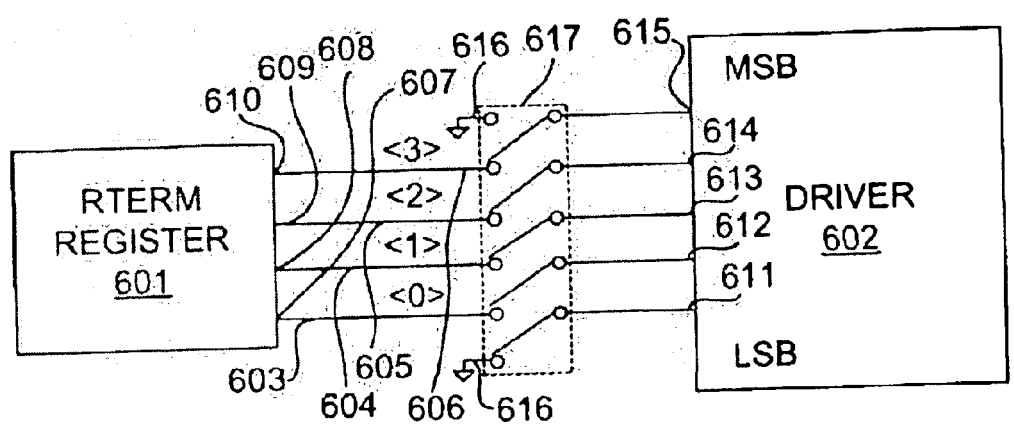

FIG. 6 is a block diagram illustrating an apparatus allowing change in termination impedance by shifting bits in accordance with an embodiment of the present invention. The apparatus of FIG. 6 comprises register 601, driver 602, conductors 603–606, register outputs 607–610, driver inputs 611–615, and fixed logic output 616. The numbers of register outputs 607–610, conductors 603–606, and driver inputs 611–615 are exemplary; any number of register outputs, conductors, and driver inputs may be provided. Fixed logic output 616 may be implemented using a reference voltage (e.g., $V_{DD}$ or ground) with or without a pull-up or pull-down resistor or other incidental components. Fixed logic output 616 is configured to provide a fixed logic level, for example, preferably a fixed low logic level or alternatively a fixed high logic level. Register outputs 607–610 are coupled via conductors 603–606, respectively, to a first set of terminals of the several poles of switching element 617. At each end of the first set of terminals, end terminals are coupled to fixed logic output 616. A second set of terminals of the several poles of switching element 617 are coupled to driver inputs 611–615. In a first configuration illustrated in FIG. 6, switching element 617 is configured to couple register outputs 607–610 to driver inputs 611–614, respectively, and to couple driver input 615 to fixed logic output 616. In a second configuration illustrated in FIG. 6, switching element 617 is configured to couple register outputs 607–610 to driver inputs 612–615, respectively, and to couple driver input 611 to fixed logic output 616. Thus, between the first configuration and the second configuration, the register outputs 607–610 have been shifted by one bit from driver inputs 611–614, respectively, to driver inputs 612–615, respectively. Switching element 617 may be implemented using any element capable of effecting the shifting described above. For example, switching element 617 may be implemented using a transistor, such as a field effect transistor or a bipolar transistor, or a multiplexer circuit. When an apparatus such as that illustrated in FIG. 4 having resistive device ratios of 1:2:4:8, etc. is used to implement driver 602, the shifting of the register outputs relative to the driver inputs allows an impedance provided by a group of resistive devices to be easily doubled or halved.

Figure 7:
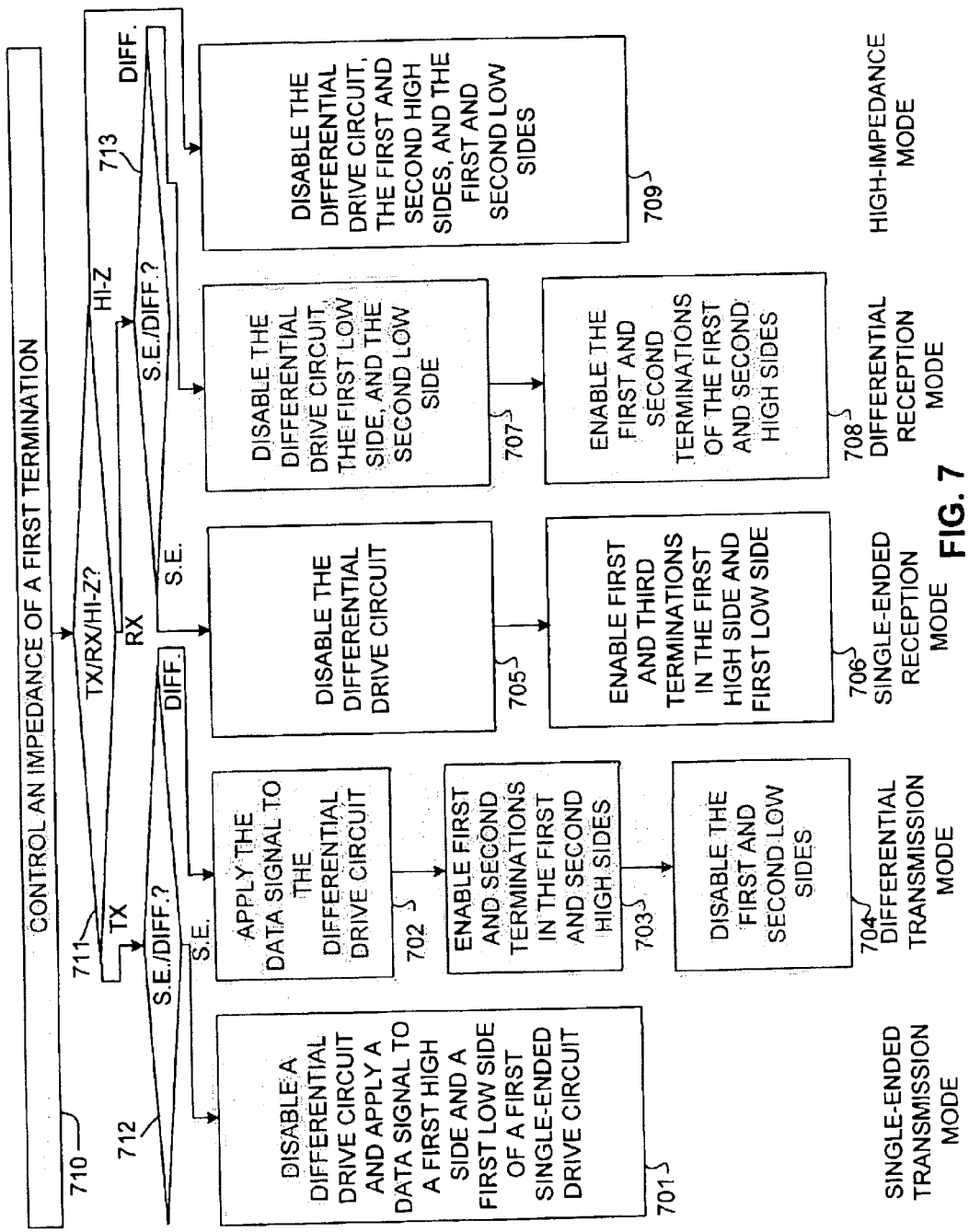
FIG. 7 is a flow diagram illustrating a method for selectably providing single-ended and differential signaling in accordance with an embodiment of the present invention.

FIG. 7 is a flow diagram illustrating a method for selectably providing single-ended and differential signaling in accordance with an embodiment of the present invention. The method begins in step 710, where an impedance of a first termination in a first high side of a first single-ended drive circuit is controlled. As an example, the impedance of the first termination may be controlled to be a particular impedance, for example, to match a characteristic impedance of a transmission line comprising a conductor to which it is coupled. In some embodiments, step 710 can be omitted. For example, if the first termination already provides proper impedance matching and operation in both single-ended and differential signaling modes is to occur using the same termination mode, for example, either a single-reference termination mode or a center termination mode, step 710 may be omitted. In step 711, a determination is made as to whether a transmission mode, a reception mode, or a high-impedance mode is desired. In a preferred embodiment, such a determination is made based on a value stored in a software-programmable register or based on an input to a mode selection pin. If a transmission mode is desired, the method continues to step 712. If a reception mode is desired, the method continues to step 713. If a high-impedance mode is desired, the method continues to step 709.

In step 712, a determination is made as to whether a single-ended transmission mode or a differential transmission mode is desired. In a preferred embodiment, such a determination is made based on a value stored in a software-programmable register or based on an input to a mode selection pin. For a single-ended transmission mode, the method continues in step 701. In step 701, a differential drive circuit is disabled and a data signal is applied to a first high side and a first low side of a first single-ended drive circuit. For a differential transmission mode, the method continues in step 702. In step 702, the data signal is applied to the differential drive circuit. In step 703, the first termination in the first high side of the first single-ended drive circuit and a second termination in a second high side of a second single-ended drive circuit are enabled. In step 704, the first and second low sides are disabled.

In step 713, a determination is made as to whether a single-ended reception mode or a differential reception mode is desired. In a preferred embodiment, such a determination is made based on a value stored in a software-programmable register or based on an input to a mode selection pin. For a single-ended reception mode, the method continues in step 705. In step 705, the differential drive circuit is disabled. In step 706, the first termination in the first high side and a third termination in the first low side are enabled. For a differential reception mode, the method continues in step 707. In step 707, the differential drive circuit, the first low side, and the second low side are disabled. In step 708, the first and second terminations of the first and second high sides are enabled.

For a high-impedance mode, the method continues in step 709. In step 709, the differential drive circuit, the first and second high sides, and the first and second low sides are disabled. From any of steps 701, 704, 706, 708, or 709, the method continues to either of steps 710 or 711. In step 710, an impedance of the first termination is controlled using a plurality of switching devices coupled to a plurality of resistive devices. In step 711, an impedance of the first termination is controlled by shifting control inputs to the plurality of switching devices. It should be understood that the terminations described in reference to FIG. 7, such as the first, second, and third terminations, may include single or multiple resistance or impedance elements between a given conductor and a given reference voltage, for example, as described in reference to FIG. 4.

Figure 8:
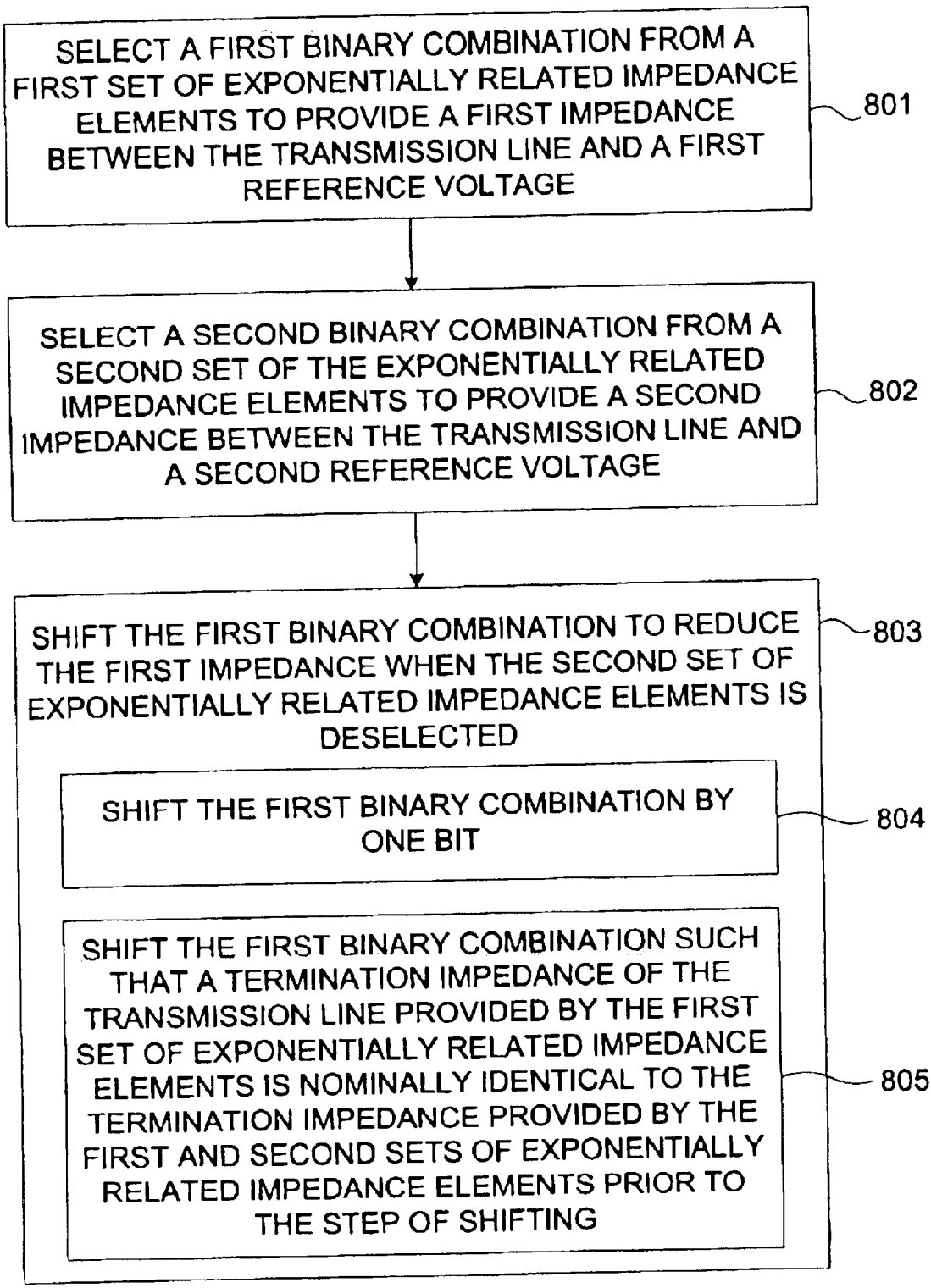
FIG. 8 is flow diagram illustrating a method for terminating a transmission line in accordance with an embodiment of the present invention.

FIG. 8 is flow diagram illustrating a method for terminating a transmission line in accordance with an embodiment of the present invention. This method may be used in either a transmission mode or a reception mode for either a single-ended signaling mode or a differential signaling mode. For example, if a different impedance relationship between a first set of impedance elements and a second set of impedance elements is desired for a transmission mode and a reception mode, this method may be used to provide such a different impedance relationship. As another example, if a different impedance relationship between a first set of impedance elements and a second set of impedance elements is desired for a single-ended signaling mode and a differential signaling mode, this method may be used to provide such a different impedance relationship.

In step 801, a first binary combination is selected from a first set of exponentially related impedance elements to provide a first impedance between the transmission line and a first reference voltage. The first binary combination is selected to provide a first impedance that preferably matches a characteristic impedance of a transmission line, such as wire 208 and/or wire 209, when the first set of exponentially related impedance elements are to be used by themselves or that, in conjunction with other impedance elements, preferably matches the characteristic impedance of the transmission line when the first set of exponentially related impedance elements are to be used in conjunction with other impedance elements. Impedance matching is understood to occur when the impedances of elements coupled to one another are close enough to maintain adequate signal integrity. If, for example, the first set of exponentially related impedance elements are to be used in conjunction with impedance elements of equal value, but referencing a different reference voltage, the first binary combination may be selected to provide a first impedance of double the characteristic impedance of the transmission line.

In step 802, a second binary combination is selected from a second set of the exponentially related impedance elements to provide a second impedance between the transmission line and a second reference voltage. If, for example, the first binary combination was selected to provide a first impedance of double the characteristic impedance of the transmission line, the second binary combination may be selected to provide a second impedance that is also double that of the characteristic impedance of the transmission line. In such a case, the second impedance, in conjunction with the first impedance, would provide a combined impedance that is closer to, and preferably matches, the characteristic impedance of the transmission line.

If the first binary combination were selected to match the characteristic impedance of the transmission line in step 801, the first binary combination would be shifted to cause the first impedance to effectively be doubled, thereby allowing the combined impedance of the first impedance and the second impedance to match the characteristic impedance of the transmission line.

In step 803, the first binary combination is shifted to reduce the first impedance when the second set of exponentially related impedance elements are deselected. Step 803 is performed so as to avoid loss of impedance matching accuracy when the first binary combination is shifted. Step 803 may comprise step 804 or step 805. In step 804, the first binary combination is shifted by one bit. In step 805, the first binary combination is shifted such that a termination impedance of the transmission line provided by the first set of exponentially related impedance elements is closer to, and preferably matches, the termination impedance provided by the first and second sets of exponentially related impedance elements prior to the step of shifting. It should be noted that the second binary combination may or may not be shifted in a manner similar to that by which the first binary combination was shifted in step 803 to provide a similar impedance adjustment for the second impedance.

Figure 9:
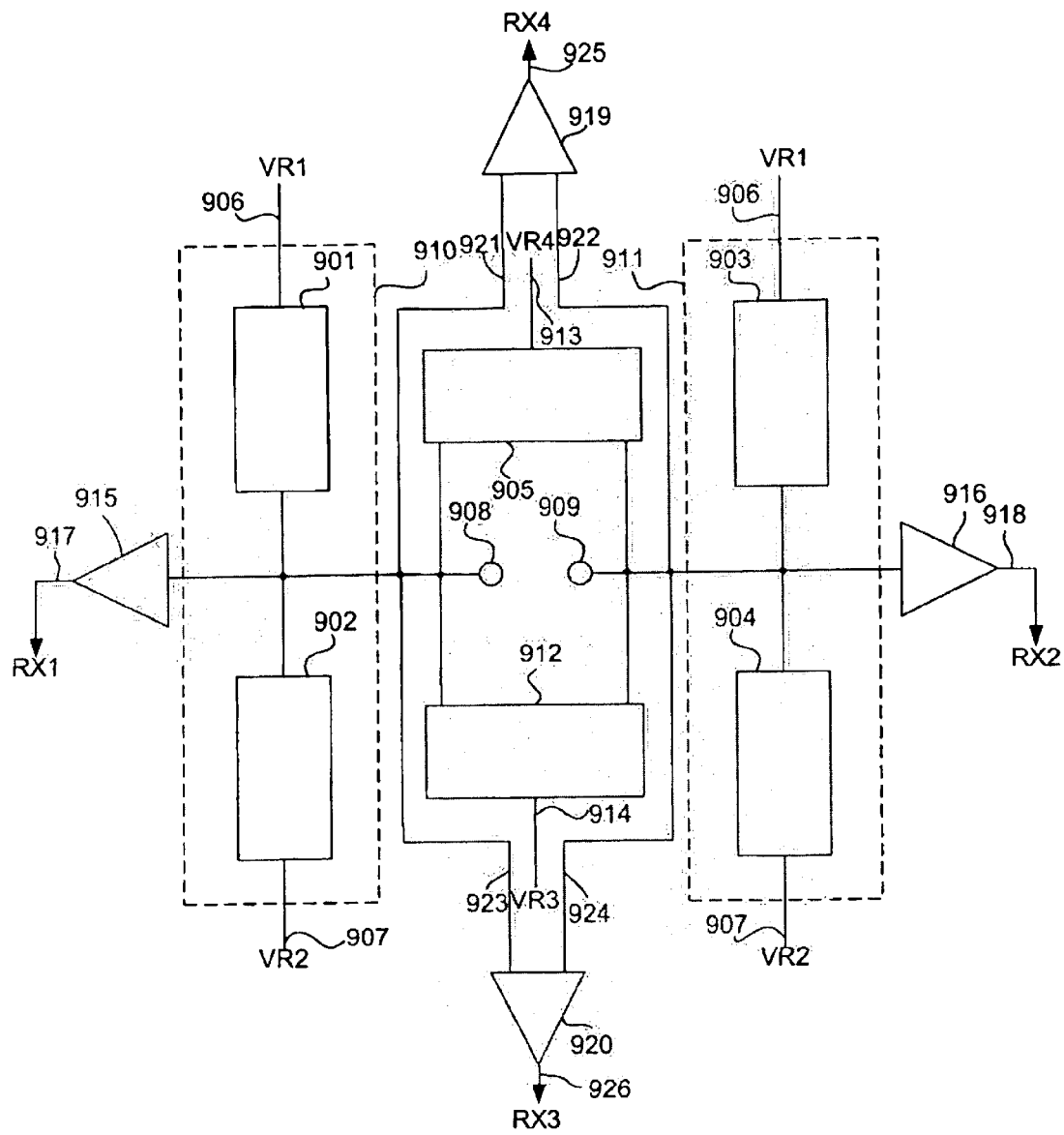
FIG. 9 is a block diagram illustrating an apparatus in accordance with an embodiment of the invention.

FIG. 9 is a block diagram illustrating an apparatus in accordance with an embodiment of the invention. The apparatus comprises a first single-ended drive circuit 910, a second single-ended drive circuit 911, a first differential drive circuit 905, a second differential drive circuit 912, a first single-ended receive circuit 915, a second single-ended receive circuit 916, a first differential receive circuit 919, and a second differential receive circuit 920. The first single-ended drive circuit 910 comprises a first high side 901 and a first low side 902. The second single-ended drive circuit 911 comprises a second high side 903 and a second low side 904. A first reference voltage 906, which may be referred to as VR1, is coupled to the first high side 901 and to the second high side 903. The first high side 901 is coupled to the first low side 902, to the first single-ended receive circuit 915, and to a first wire 908. The first single-ended receive circuit 915 provides output 917, which may be referred to as RX1. The second high side 903 is coupled to the second low side 904, to the second single-ended receive circuit 916, and to a second wire 909. The second single-ended receive circuit 916 provides output 918, which may be referred to as RX2. The first low side 902 and the second low side 904 are coupled to a second reference voltage 907, which may be referred to as VR2.

The first differential drive circuit 905 is coupled to the first wire 908, to the second wire 909, and to a fourth reference voltage 913, which may be referred to as VR4. VR4 may be the same voltage as either VR1 or VR2, or it may be a different voltage. The second differential drive circuit 912 is coupled to the first wire 908, to the second wire 909, and to a third reference voltage 914, which may be referred to as VR3. VR3 may be the same voltage as either VR1 or VR2, or it may be a different voltage.

The first differential receive circuit 919 has inputs 921 and 922 coupled to conductors 908 and 909, respectively. The first differential receive circuit 919 produces output 925, which may be referred to as RX4. The second differential receive circuit 920 has inputs 923 and 924 coupled to conductors 908 and 909, respectively. The second differential receive circuit 920 produces output 926, which may be referred to as RX3.

Figure 10:
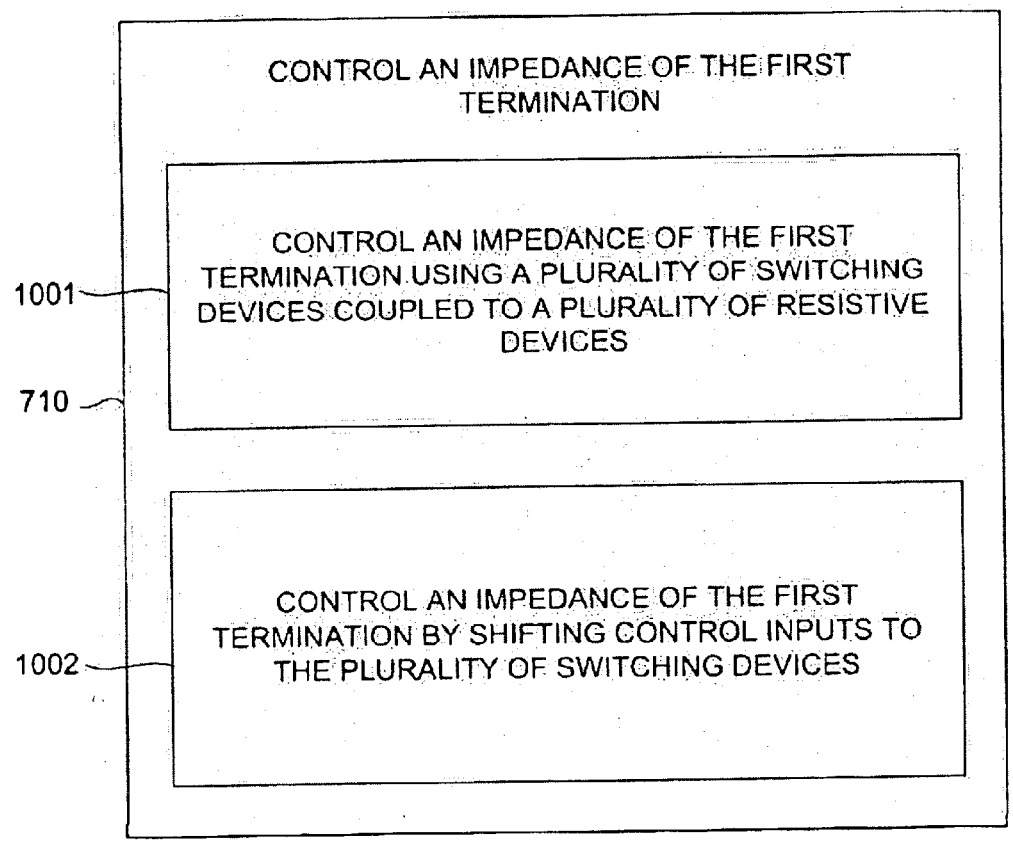
FIG. 10 is a flow diagram illustrating examples of steps for implementing step 710 of FIG. 7.

FIG. 10 is a flow diagram illustrating examples of steps for implementing step 710 of FIG. 7. As noted in reference to FIG. 7, in step 710, an impedance of the first termination is controlled. Step 710 may comprise steps 1001 and/or 1002. In step 1001, an impedance of the first termination is controlled using a plurality of switching devices coupled to a plurality of resistive devices. The switching devices and the resistive devices may be separate devices, or, if one set of devices is capable of providing both the switching and the resistance functionality, that one set of devices may serve as both the switching devices and the resistive devices, obviating the need for separate types of devices. As an example, MOSFET transistors may be fabricated so as to have an on resistance providing the resistance functionality, while also providing the switching functionality.

It should be understood that, while examples set forth above have been presented in the context of certain semiconductor processing technologies, for example, complementary metal-oxide semiconductor (CMOS), one of ordinary skill in the art would, in view of the disclosure presented herein, readily appreciate the applicability of the invention to other semiconductor processing technologies, for example, bipolar technology, other types of field-effect transistor technology (e.g., JFET, IGFET, etc.), other types of Type IV semiconductor technology, other types of Type III–V semiconductor technology, etc.

Accordingly, a method and apparatus for providing single-ended and differential signaling with selectable impedance and transition time has been described. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A method for providing single-ended signaling in a memory controller comprising the steps of:
    disabling a differential drive circuit coupled to a first signal line and a second signal line in the memory controller;
    controlling a first single-ended drive circuit coupled to the first signal line in the memory controller so as to provide a first single-ended signal on the first signal line; and
    controlling a second single-ended drive circuit coupled to the second signal line in the memory controller so as to provide a second single-ended signal on the second signal line.

2. The method of claim 1, wherein the differential drive circuit is disabled so as to provide high impedances on the first signal line and the second signal line.

3. The method of claim 2, wherein the high impedances on the first signal line and the second signal line effectively isolate the first signal line and the second signal line from an influence of any voltage reference through the differential drive circuit.

4. A method for providing single-ended signaling in a memory controller comprising the steps of:
    disabling a differential drive circuit coupled to a first signal line and a second signal line in the memory controller;
    controlling a first single-ended drive circuit coupled to the first signal line in the memory controller so as to provide a first single-ended signal on the first signal line; and
    controlling a second single-ended drive circuit coupled to the second signal line in the memory controller so as to enable a termination of the second signal line.

5. The method of claim 4, wherein the differential drive circuit is disabled so as to provide high impedances on the first signal line and the second signal line.

6. The method of claim 5, wherein the high impedances on the first signal line and the second signal line effectively isolate the first signal line and the second signal line from an influence of any voltage reference through the differential drive circuit.

7. The method of claim 4, wherein the termination of the second signal line is a single reference termination of the second signal line.

8. The method of claim 4, wherein the termination of the second signal line is a double reference termination of the second signal line.

9. A method for providing single-ended signaling in a memory controller comprising the steps of:
    disabling a differential drive circuit coupled to a first signal line and a second signal line in the memory controller;
    controlling a first single-ended drive circuit coupled to the first signal line in the memory controller so as to provide a first single-ended signal on the first signal line; and
    controlling a second single-ended drive circuit coupled to the second signal line in the memory controller so as to provide a high impedance on the second signal line.

10. The method of claim 9, wherein the differential drive circuit is disabled so as to provide high impedances on the first signal line and the second signal line.

11. The method of claim 10, wherein the high impedances on the first signal line and the second signal line effectively isolate the first signal line and the second signal line from an influence of any voltage reference through the differential drive circuit.

12. The method of claim 9, wherein the high impedance on the second signal line effectively isolates the second signal line from an influence of any voltage reference through the second single-ended drive circuit.

13. A method for terminating signal lines in a memory controller comprising the steps of:
    disabling a differential drive circuit coupled to a first signal line and a second signal line in the memory controller;
    controlling a first single-ended drive circuit coupled to the first signal line in the memory controller so as to enable a termination of the first signal line; and
    controlling a second single-ended drive circuit coupled to the second signal line in the memory controller so as to enable a termination of the second signal line.

14. The method of claim 13, wherein the differential drive circuit is disabled so as to provide high impedances on the first signal line and the second signal line.

15. The method of claim 14, wherein the high impedances on the first signal line and the second signal line effectively isolate the first signal line and the second signal line from an influence of any voltage reference through the differential drive circuit.

16. The method of claim 13, wherein the termination of the first signal line is a single reference termination of the first signal line.

17. The method of claim 13, wherein the termination of the first signal line is a double reference termination of the first signal line.

18. The method of claim 13, wherein the termination of the second signal line is a single reference termination of the second signal line.

19. The method of claim 13, wherein the termination of the second signal line is a double reference termination of the second signal line.

20. A method for terminating and isolating signal lines in a memory controller comprising the steps of:
    disabling a differential drive circuit coupled to a first signal line and a second signal line in the memory controller;
    controlling a first single-ended drive circuit coupled to the first signal line in the memory controller so as to enable a termination of the first signal line; and
    controlling a second single-ended drive circuit coupled to the second signal line in the memory controller so as to provide a high impedance on the second signal line.

21. The method of claim 20, wherein the differential drive circuit is disabled so as to provide high impedances on the first signal line and the second signal line.

22. The method of claim 21, wherein the high impedances on the first signal line and the second signal line effectively isolate the first signal line and the second signal line from an influence of any voltage reference through the differential drive circuit.

23. The method of claim 20, wherein the termination of the first signal line is a single reference termination of the first signal line.

24. The method of claim 20, wherein the termination of the first signal line is a double reference termination of the first signal line.

25. The method of claim 20, wherein the high impedance on the second signal line effectively isolates the second signal line from an influence of any voltage reference through the second single-ended drive circuit.

26. A method for isolating a memory controller comprising the steps of:
    disabling a differential drive circuit coupled to a first signal line and a second signal line in the memory controller;
    controlling a first single-ended drive circuit coupled to the first signal line in the memory controller so as to provide a high impedance on the first signal line; and
    controlling a second single-ended drive circuit coupled to the second signal line in the memory controller so as to provide a high impedance on the second signal line.

27. The method of claim 26, wherein the differential drive circuit is disabled so as to provide high impedances on the first signal line and the second signal line.

28. The method of claim 27, wherein the high impedances on the first signal line and the second signal line effectively isolate the first signal line and the second signal line from an influence of any voltage reference through the differential drive circuit.

29. The method of claim 26, wherein the high impedance on the first signal line effectively isolates the first signal line from an influence of any voltage reference through the first single-ended drive circuit.

30. The method of claim 26, wherein the high impedance on the second signal line effectively isolates the second signal line from an influence of any voltage reference through the second single-ended drive circuit.

31. A method for providing differential signaling in a memory controller comprising the steps of:
    controlling a first single-ended drive circuit coupled to a first signal line in the memory controller so as to enable a termination of the first signal line;
    controlling a second single-ended drive circuit coupled to a second signal line in the memory controller so as to enable a termination of the second signal line; and
    controlling a differential drive circuit coupled to the first signal line and the second signal line in the memory controller so as to provide a differential signal across the first signal line and the second signal line.

32. The method of claim 31, wherein the termination of the first signal line is a single reference termination of the first signal line.

33. The method of claim 31, wherein the termination of the first signal line is a double reference termination of the first signal line.

34. The method of claim 31, wherein the termination of the second signal line is a single reference termination of the second signal line.

35. The method of claim 31, wherein the termination of the second signal line is a double reference termination of the second signal line.

36. A memory controller comprising:
    a differential drive circuit coupled to a first signal line and a second signal line in the memory controller, and configured to provide a differential signal across the first signal line and the second signal line when enabled;
    a first single-ended drive circuit coupled to the first signal line in the memory controller, and configured to provide a first single-ended signal on the first signal line, provide a high impedance on the first signal line, or enable a termination of the first signal line; and
    a second single-ended drive circuit coupled to the second signal line in the memory controller, and configured to provide a second single-ended signal on the second signal line, provide a high impedance on the second signal line, or enable a termination of the second signal line.

37. The memory controller of claim 36, wherein the termination of the first signal line is a single reference termination of the first signal line.

38. The memory controller of claim 36, wherein the termination of the first signal line is a double reference termination of the first signal line.

39. The memory controller of claim 36, wherein the high impedance on the first signal line effectively isolates the first signal line from an influence of any voltage reference through the first single-ended drive circuit.

40. The memory controller of claim 36, wherein the termination of the second signal line is a single reference termination of the second signal line.

41. The memory controller of claim 36, wherein the termination of the second signal line is a double reference termination of the second signal line.

42. The memory controller of claim 36, wherein the high impedance on the second signal line effectively isolates the second signal line from an influence of any voltage reference through the second single-ended drive circuit.

43. The memory controller of claim 36, wherein the differential drive circuit is further configured to provide high impedances on the first signal line and the second signal line when disabled.

44. The memory controller of claim 43, wherein the high impedances on the first signal line and the second signal line provided by the differential drive circuit effectively isolate the first signal line and the second signal line from an influence of any voltage reference through the differential drive circuit.

* * * * *